United States Patent
Xiong et al.

(10) Patent No.: US 9,214,958 B2
(45) Date of Patent: Dec. 15, 2015

(54) METHOD AND DECODER FOR PROCESSING DECODING

(71) Applicant: Huawei Technologies Co., Ltd., Shenzhen, Guangdong (CN)

(72) Inventors: Jie Xiong, Shanghai (CN); Yuejun Wei, Moscow (RU)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/488,168

(22) Filed: Sep. 16, 2014

(65) Prior Publication Data
US 2015/0006992 A1    Jan. 1, 2015

Related U.S. Application Data

(63) Continuation of application No. PCT/CN2012/084675, filed on Nov. 15, 2012.

(51) Int. Cl.
*H03M 13/29* (2006.01)
*H03M 13/11* (2006.01)
*H03M 13/45* (2006.01)
(Continued)

(52) U.S. Cl.
CPC ....... *H03M 13/1108* (2013.01); *G06F 11/1004* (2013.01); *H03M 13/2957* (2013.01); *H03M 13/2966* (2013.01); *H03M 13/3707* (2013.01);
(Continued)

(58) Field of Classification Search
CPC .................................................. H03M 13/2957

USPC ................................................. 714/755, 801
See application file for complete search history.

(56) References Cited

U.S. PATENT DOCUMENTS

| 5,499,030 A | 3/1996 | Wicks et al. |
| 7,442,212 B2 | 10/2008 | Richmond et al. |

(Continued)

FOREIGN PATENT DOCUMENTS

| CN | 101867379 A | 10/2010 |
| CN | 102111162 A | 6/2011 |
| CN | 102356632 A | 2/2012 |

OTHER PUBLICATIONS

Satoshi Gounai, et al., "Decoding Algorithms Based on Oscillation for Low-Density Parity Check Codes", IEICE Trans. Fundamentals, vol. E88-A, Aug. 2005, p. 2216-2226.
(Continued)

*Primary Examiner* — Fritz Alphonse (57) ABSTRACT

Embodiments of the present invention provide a method and a decoder for processing decoding. The method includes: acquiring a combined generator matrix $G_{com}$ of a Turbo code generator matrix $G_{turbo}$ and a cyclic redundancy check CRC generator matrix $G_{crc}$, and acquiring a log likelihood ratio sequence outputted by a Turbo code decoder; and performing CRC-assisted iterative ordered statistics decoding of a Turbo code by using the combined generator matrix $G_{com}$ and the log likelihood ratio sequence, so as to obtain a decoding processing result. A decoding performance gain can be improved by using the method and the device for decoding a Turbo code provided in the embodiments of the present invention.

12 Claims, 7 Drawing Sheets

Acquire a combined generator matrix $G_{com}$ of a Turbo code generator matrix $G_{turbo}$ and a cyclic redundancy check CRC generator matrix $G_{crc}$, and acquire a log likelihood ratio sequence outputted by a Turbo code decoder — S101

Perform CRC-assisted iterative ordered statistics decoding of a Turbo code by using the combined generator matrix $G_{com}$ and the log likelihood ratio sequence and obtain a decoding processing result — S102

(51) Int. Cl.
*G06F 11/10* (2006.01)
*H03M 13/00* (2006.01)
*H03M 13/37* (2006.01)
*H03M 13/09* (2006.01)

(52) U.S. Cl.
CPC .......... *H03M 13/451* (2013.01); *H03M 13/613* (2013.01); *H03M 13/09* (2013.01)

(56) References Cited

U.S. PATENT DOCUMENTS

| 8,792,594 | B2* | 7/2014 | Vojcic et al. | 375/340 |
|---|---|---|---|---|
| 2005/0229091 | A1* | 10/2005 | Narayanan et al. | 714/801 |
| 2010/0232550 | A1 | 9/2010 | Lee et al. | |

OTHER PUBLICATIONS

Youssouf Ould-Cheikh-Mouhamedou, et al., "Improving the Error Rate Performance of Turbo Codes using the Forced Symbol Method", IEEE Communications Letters, vol. 11, No. 7, Jul. 2007, p. 616-618.

Krishna R. Narayanan, et al., List Decoding of Turbo Codes, IEEE Transactions on Communications, vol. 46, No. 6, Jun. 1998, p. 754-762.

Marc P. C. Fossorier, et al., "Soft-Decision Decoding of Linear Block Codes Based on Ordered Statistics", IEEE Transactions on Information Theory, vol. 41, No. 5, Sep. 1995, p. 1379-1396.

Ming Jiang, "Research on the Decoding Algorithms of Low-Density Parity-Check Codes and Their Applications", Oct. 2006, 112 pages.

Motohiko Isaka, et al., "On the Suboptimality of Iterative Decoding for Turbo-Like and LDPC Codes With Cycles in Their Graph Representation", IEEE Transactions on Communications, vol. 52, No. 5, May 2004, p. 845-854.

Yijia Xu, et al., "An Efficient OSD-aided Interative Decoding Algorithm for LTE Turbo Codes", IEEE Conference on Wireless Communications & Signal Processing, Oct. 25, 2012, 4 pages.

Li Yang, et al., "Decoding Low-Density Parity-Check Codes with Error-Floor Free over the AWGN Channel", IEEE International Conference on Wireless Communications, Networking and Information Security, Jun. 25, 2010, p. 192-196.

Renqiu Wang, et al., "CRC-Assisted Error Correction in a Convolutionally Coded System", IEEE Transactions on Communications, vol. 56, No. 11, Nov. 1, 2008, p. 1807-1815.

Huy G. Vu, et al., "Iterative Ordered-Statistic Decoding for LDPC Coded Modulation Systems", IEEE, May 2005, p. 196-199.

Marc P. C. Fossorier, "Iterative Reliability-Based Decoding of Low-Density Parity Check Codes", IEEE Journal on Selected Areas in Communications, vol. 19, No. 5, May 2001, p. 908-917.

* cited by examiner

METHOD AND DECODER FOR PROCESSING DECODING

CROSS-REFERENCE TO RELATED APPLICATIONS

This application is a continuation of International Application No. PCT/CN2012/084675, filed on Nov. 15, 2012, which is hereby incorporated by reference in its entirety.

TECHNICAL FIELD

Embodiments of the present invention relate to the field of communications technologies, and in particular, to a method and a decoder for processing decoding.

BACKGROUND

In a modern communications system, to ensure reliable and effective transmission of various data in a channel, an error correction coding technology generally needs to be used. Particularly, development of wireless digital communications and emergence of various high-speed and bursty services impose increasingly high requirements on the error correction coding technology. A Turbo code implements content at a stage from channel coding to channel decoding in a communications system, and its bit error rate plays a decisive role in the whole system.

The Turbo code is a forward error correction channel coding and decoding technology; a Turbo encoder includes two recursive cyclic convolutional codes combined by using an interleaver in a parallel concatenated manner, and a decoding manner of feedback iteration is used. To improve decoding performance of the Turbo code, an iterative Turbo-code decoding method assisted by a list Viterbi algorithm is used in the prior art. According to this method, on the basis of conventional iterative Turbo decoding, a list Viterbi algorithm is performed by using soft outputs from iterations and multiple optimal paths are outputted; detection of error frames is performed by using cyclic redundancy check (CRC for short) and the iteration is terminated prematurely, or a suboptimal path is outputted.

However, when the iterative Turbo code decoding method assisted by the list Viterbi algorithm is used in a communications system, a performance gain is not large.

SUMMARY

Embodiments of the present invention provide a method and a device for decoding a Turbo code, so as to increase a decoding gain.

In a first aspect, an embodiment of the present invention provides a method for processing decoding, including:

acquiring a combined generator matrix $G_{com}$ of a Turbo code generator matrix $G_{turbo}$ and a cyclic redundancy check CRC generator matrix $G_{crc}$, and acquiring a log likelihood ratio sequence outputted by a Turbo code decoder; and performing CRC-assisted iterative ordered statistics decoding of the Turbo code by using the combined generator matrix $G_{com}$ and the log likelihood ratio sequence, and obtaining a decoding processing result.

In a first possible implementation manner, according to the first aspect, specific implementation is as follows: the acquiring a log likelihood ratio sequence outputted by a Turbo code decoder includes:

acquiring a log likelihood ratio sequence that is outputted by a component decoder of the Turbo code decoder after iterative decoding for the number of first inner iterations; or accumulating a log likelihood ratio outputted from each iteration after the component decoder performs iterative decoding for the number of second inner iterations, and acquiring an accumulated log likelihood ratio sequence.

In a second possible implementation manner, according to the first aspect or the first possible implementation manner of the first aspect, specific implementation is as follows: the performing CRC-assisted iterative ordered statistics decoding of the Turbo code by using the combined generator matrix $G_{com}$ and the log likelihood ratio sequence and obtaining a decoding processing result includes:

acquiring a hard-decision sequence C according to the log likelihood ratio sequence, where there is mapping between the log likelihood ratio sequence, the hard-decision sequence C, and the combined generator matrix $G_{com}$;

obtaining a reliability sequence by calculating absolute values of log likelihood ratios in the log likelihood ratio sequence;

sorting the absolute values of the log likelihood ratios in the reliability sequence and obtaining an ordered combined generator matrix $O_1(G_{com})$ and a hard-decision sequence $O_1(C)$ according to the mapping;

obtaining, by Gauss-eliminating the ordered combined generator matrix $O_1(G_{com})$, a Gauss-eliminated matrix $G_{gauss}$ and a matrix $O_2$, and obtaining a reordered hard-decision sequence $O_2(O_1(C))$ according to the mapping and the matrix $O_2$; and encoding first $K_m$ columns of the hard-decision sequence $O_2(O_1(C))$ and the Gauss-eliminated matrix $G_{gauss}$ to obtain a code word $\tilde{C}$ after ordered statistics decoding, and performing reverse reordering to obtain a decoding processing result $C_1 = O_1^{-1}(O_2^{-1}(\tilde{C}))$, where $K_m$ is a length of an original information sequence.

In a third possible implementation manner, according to the second possible implementation manner of the first aspect, after the obtaining a decoding processing result, the following is further included:

outputting a decoding result if a Euclidean distance between the decoding processing result and the information sequence received by the Turbo code decoder is smaller than a preset decision threshold, which indicates that a decision is passed; and performing bit-flipping decoding if the Euclidean distance between the decoding processing result and the information sequence received by the Turbo code decoder is greater than the preset decision threshold, which indicates that the decision is not passed.

In a fourth possible implementation manner, according to the third possible implementation manner of the first aspect, the performing bit flipping decoding includes:

flipping at least one bit of first $K_m$ bit symbols of the hard-decision sequence $O_2(O_1(C))$ in bitwise traversal to obtain a bit-flipped hard-decision sequence; and encoding the bit-flipped hard-decision sequence and the Gauss-eliminated matrix $G_{gauss}$ to obtain a code word $\tilde{C}^k$ after ordered statistics decoding, and performing reverse reordering to obtain a bit-flipped decoding processing result $C_2 = O_1^{-1}(O_2^{-1}(\tilde{C}^k))$.

In a fifth possible implementation manner, according to the third possible implementation manner of the first aspect or the fourth possible implementation manner of the first aspect, the preset decision threshold is determined in the following manner:

Under a condition that an iteration in the Turbo code decoding method is incorrect, a minimum value of the Euclidean distance between the decoding processing result of incorrectly decoded frames and the information sequence received by the Turbo code decoder is determined; and any value smaller than the minimum value is determined as the preset decision threshold.

In a second aspect, an embodiment of the present invention provides a decoder, including:

a receiver, configured to acquire a combined generator matrix $G_{com}$ of a Turbo code generator matrix $G_{turbo}$ and a cyclic redundancy check CRC generator matrix $G_{crc}$, and acquire a log likelihood ratio sequence outputted by a Turbo code decoder; and a processor, configured to perform CRC-assisted iterative ordered statistics decoding of a Turbo code by using the combined generator matrix $G_{com}$ and the log likelihood ratio sequence, and obtain a decoding processing result.

In a first possible implementation manner, according to the second aspect, specific implementation is as follows: the receiver is specifically configured to:

acquire the log likelihood ratio sequence that is outputted by a component decoder of the Turbo code decoder after iterative decoding for the number of first inner iterations; or accumulate a log likelihood ratio outputted from each iteration after the component decoder performs iterative decoding for the number of second inner iterations, and acquire an accumulated log likelihood ratio sequence.

In a second possible implementation manner, according to the second aspect or the first possible implementation manner of the second aspect, specific implementation is as follows: the processor is specifically configured to:

acquire a hard-decision sequence C according to the log likelihood ratio sequence, where there is mapping between the log likelihood ratio sequence, the hard-decision sequence C, and the combined generator matrix $G_{com}$;

obtain a reliability sequence by calculating absolute values of log likelihood ratios in the log likelihood ratio sequence;

sort the absolute values of the log likelihood ratios in the reliability sequence and obtain an ordered combined generator matrix $O_1(G_{com})$ and a hard-decision sequence $O_1(C)$ according to the mapping;

obtain, by Gauss-eliminating the ordered combined generator matrix $O_1(G_{com})$, a Gauss-eliminated matrix $G_{gauss}$ and a matrix $O_2$, and obtain a reordered hard-decision sequence $O_2(O_1(C))$ according to the mapping and the matrix $O_2$; and encode first $K_m$ columns of the hard-decision sequence $O_2(O_1(C))$ and the Gauss-eliminated matrix $G_{gauss}$ to obtain a code word C after ordered statistics decoding, and perform reverse reordering to obtain a decoding processing result $C_1 = O_1^{-1}(O_2^{-1}(\tilde{C}))$, where $K_m$ is a length of an original information sequence.

In a third possible implementation manner, according to the second possible implementation manner of the second aspect, the processor is further specifically configured to:

output a decoding result if a Euclidean distance between the decoding processing result and the information sequence received by the Turbo code decoder is smaller than a preset decision threshold, which indicates that a decision is passed; and perform bit-flipping decoding if the Euclidean distance between the decoding processing result and the information sequence received by the Turbo code decoder is greater than the preset decision threshold, which indicates that the decision is not passed.

In a fourth possible implementation manner, according to the third possible implementation manner of the second aspect, the decoding module is specifically configured to:

flip at least one bit of first $K_m$ bit symbols of the hard-decision sequence $O_2(O_1(C))$ in bitwise traversal to obtain a bit-flipped hard-decision sequence; and encode the bit-flipped hard-decision sequence and the Gauss-eliminated matrix $G_{gauss}$ to obtain a code word $\tilde{C}^k$ after ordered statistics decoding, and perform reverse reordering to obtain a bit-flipped decoding processing result $C_2 = O_1^{-1}(O_2^{-1}(\tilde{C}^k))$.

In a fifth possible implementation manner, according to the third possible implementation manner of the second aspect or the fourth possible implementation manner of the second aspect, the processor is further specifically configured to:

determine, under a condition that an iteration in the Turbo code decoding method is incorrect, a minimum value of the Euclidean distance between the decoding processing result of incorrectly decoded frames and the information sequence received by the Turbo code decoder; and determine any value smaller than the minimum value as the preset decision threshold.

Embodiments of the present invention provide a method and a decoder for decoding a Turbo code. According to the method for decoding a Turbo code, a combined generator matrix $G_{com}$ of a Turbo code generator matrix $G_{turbo}$ and a cyclic redundancy check CRC generator matrix $G_{crc}$ is acquired; a log likelihood ratio sequence outputted by the Turbo code decoder is acquired; CRC-assisted iterative ordered statistics decoding of the Turbo code is performed by using the combined generator matrix $G_{com}$ and the log likelihood ratio Sequence; and a decoding processing result is obtained. Compared with the prior art, the method can improve performance of Turbo code decoding and obtain a larger decoding gain.

BRIEF DESCRIPTION OF THE DRAWINGS

To describe the technical solutions in the embodiments of the present invention more clearly, the following briefly introduces the accompanying drawings required for describing the embodiments. Apparently, the accompanying drawings in the following description show merely some embodiments of the present invention, and a person of ordinary skill in the art may still derive other drawings from these accompanying drawings without creative efforts.

DETAILED DESCRIPTION

The following clearly and describes the technical solutions in the embodiments of the present invention with reference to the accompanying drawings in the embodiments of the present invention. Apparently, the described embodiments are merely a part rather than all of the embodiments of the present invention. All other embodiments obtained by a person of ordinary skill in the art based on the embodiments of the present invention without creative efforts shall fall within the protection scope of the present invention.

In a communications system, due to impact of factors such as a channel and noise, an error may inevitably occur during data transmission. To decrease a bit error rate under a condition of a same signal-to-noise ratio, a transmit end needs to adopt suitable channel coding, and a receive end needs to perform corresponding decoding to recover normal data. A method for processing decoding in the embodiments of the present invention may be applied to decoding at the receive end of the communications system.

In the embodiments of the present invention, the method for decoding a Turbo code is described by using a long term evolution (Long Term Evolution, LTE for short) communications system as an example, but is not a limitation on the embodiments of the present invention. Any recovery of normal data through Turbo code decoding may be implemented by using the method for decoding a Turbo code in the embodiments of the present invention.

Figure 1:
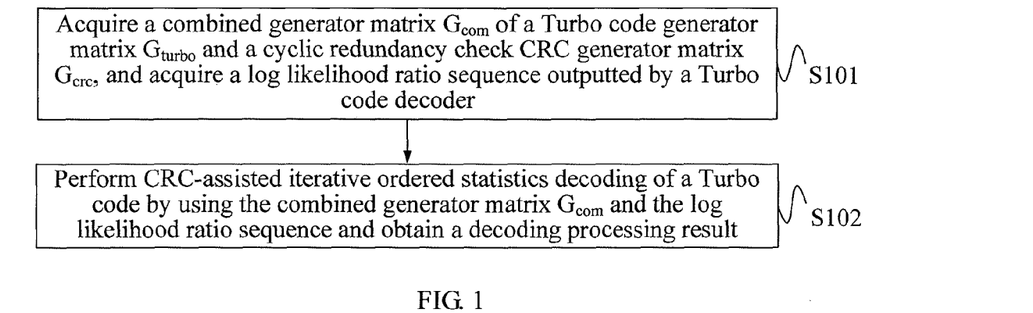
FIG. 1 is a schematic flowchart of a method for processing decoding according to Embodiment 1 of the present invention.

FIG. 1 is a schematic flowchart of a method for processing decoding according to Embodiment 1 of the present invention. As shown in FIG. 1, the method for processing decoding provided in the embodiment of the present invention includes the following steps:

S101: Acquire a combined generator matrix $G_{com}$ of a Turbo code generator matrix $G_{turbo}$ and a cyclic redundancy check CRC generator matrix $G_{crc}$, and acquire a log likelihood ratio sequence outputted by a Turbo code decoder; and S102: Perform CRC-assisted iterative ordered statistics decoding of a Turbo code by using the combined generator matrix $G_{com}$ and the log likelihood ratio sequence, and obtain a decoding processing result.

Figure 2:
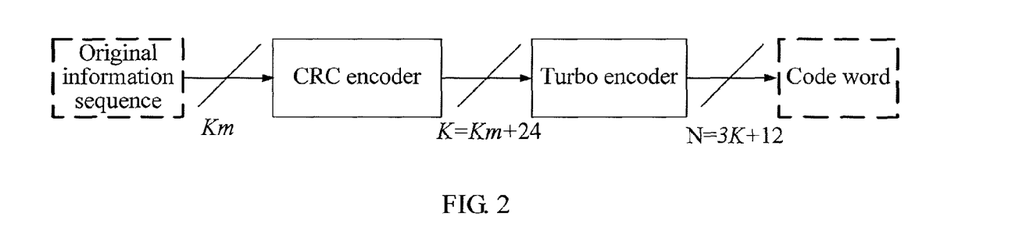
FIG. 2 is a schematic diagram of an encoding procedure according to an embodiment of the present invention.

In an LTE system, CRC encoding is performed before Turbo code encoding; an output result of a Turbo code encoder is actually a Turbo-CRC concatenated code. An encoding process is shown in FIG. 2.

In a decoding process, the CRC generator matrix and the Turbo code generator matrix are considered together and participate in decoding jointly. This turns decoding into a concatenated encoding manner.

In step S101, a Turbo code in an LTE communications system is generated by concatenating two recursive systematic convolutional component codes in parallel; and a generator polynomial of a single recursive systematic convolutional component code is:

$$g(D) = \left[1, \frac{1+D+D^3}{1+D^2+D^3}\right] \quad (1)$$

where $$\frac{1+D+D^3}{1+D^2+D^3} = (1+D+D^3)\sum_{i=0}^{\infty}(D^2+D^3)^i = \quad (2)$$

$$1 + (a_0 1 + a_1 D^1 + a_2 D^2 + a_3 D^3 + a_4 D^4 + a_5 D^5 + a_6 D^6)\sum_{i=0}^{\infty} D^{7i}$$

A corresponding Turbo code generator matrix is:

$$G_{turbo} = [I_{K \times K} | P_{K \times K} | \tilde{P}_{K \times K}] \quad (3)$$

where K is a length of an information sequence to be encoded, $I_{K \times K}$ is a unit matrix obtained after Gauss-eliminating the first K columns, D is a polynomial variable, and $\tilde{P}_{K \times K}$ is a matrix obtained after columns of $P_{K \times K}$ are swapped according to an address interleaved by an interleaver. $P_{K \times K}$ is obtained by sequentially shifting the generator polynomial shown in formula (2).

In the LTE system, for a code with a length smaller than or equal to 6144 bits, CRC24a is generally used and its generator polynomial is:

$$g_{crc}(D) = \sum_{i=0}^{24} g_i \times D = 1 + D + D^6 + D^7 + D^{10} + \quad (4)$$

$$D^{13} + D^{14} + D^{17} + D^{18} + D^{19} + D^{20} + D^{21} + D^{23} + D^{24}$$

A corresponding CRC generator matrix is:

$$G_{crc} = [I_{Km} \times I_{Km} | P_{Km \times 24}] \quad (5)$$

where $K_m$ is a length of an original information sequence, $I_{Km} \times I_{Km}$ is a unit matrix obtained after Gauss-eliminating the first $K_m$ columns, and $P_{Km \times 24}$ is obtained by sequentially shifting the generator polynomial shown in formula (4). Particularly, as shown in FIG. 2, K is related to $K_m$ by $K=K_m+24$, where 24 means a 24-bit CRC check code. A final combined generator matrix of the CRC code and the Turbo code is:

$$G_{com} = G_{turbo} \cdot G_{crc} \quad (6)$$

Before the Turbo code decoder outputs a hard-decision result, the output value is a log likelihood ratio sequence of the information. In step S101, when CRC-assisted iterative ordered statistics decoding of a Turbo code is performed, the log likelihood ratio sequence of the information may be acquired by using a conventional iterative decoding algorithm.

The conventional iterative decoding algorithm includes a maximum a posteriori (Maximum A Posteriori, MAP for short) and another Turbo code decoding algorithm that has a soft output, such as a soft-output Viterbi algorithm (Soft-Output Viterbi Algorithm, SOVA for short). The method for decoding a Turbo code provided in the embodiment of the present invention is applicable to any iterative decoding that can implement soft input soft output. The MAP algorithm is a frequently used Turbo decoding algorithm, and the MAP algorithm includes a simplified MAP algorithm and a Max- Log-MAP algorithm. Particularly, the log likelihood ratio sequence serves as a soft output of the iterative decoding, and a log likelihood ratio is a likelihood probability value rather than a decided binary sequence of 0s and 1s.

In step S102, according to the embodiment of the present invention, after the iterative decoding of the Turbo code ends, CRC-assisted iterative ordered statistics decoding of the Turbo code is performed by using the combined generator matrix $G_{com}$ and the log likelihood ratio sequence, and a decoding processing result is obtained. The main procedure is as follows: a hard-decision sequence C is acquired according to the log likelihood ratio sequence, and a reliability sequence is obtained by calculating absolute values of log likelihood ratios in the log likelihood ratio sequence; the absolute values of the log likelihood ratios in the reliability sequence are sorted in descending order, and a descendingly ordered combined generator matrix $O_1(G_{com})$ and a hard-decision sequence $O_1(C)$ are obtained according to mapping; the ordered combined generator matrix $O_1(G_{com})$ is Gauss-eliminated, where the Gauss elimination is specifically eliminating the first $K_m$ columns to a unit matrix, so as to obtain a Gauss-eliminated matrix $G_{gauss}$; and because linear dependence may occur between the columns of the matrix in a Gauss elimination process, these linearly-dependent columns are sorted again in descending order to acquire a permutation pattern $O_2$. An obtained reordered hard-decision sequence $O_2(O_1(C))$, first $K_m$ columns of the hard-decision sequence $O_2(O_1(C))$, and a Gauss-eliminated matrix $G_{gauss}$ are encoded to obtain a code word $\check{C}$ after ordered statistics decoding, and the code word is reverse reordered to obtain a decoding processing result.

Compared with conventional ordered statistics decoding, the iterative ordered statistics decoding of the Turbo code assisted by a CRC generator matrix for re-encoding has extra Gauss elimination of a CRC24a generator matrix; therefore, complexity is relatively increased. However, because a CRC24a and Turbo combined generator matrix has 24 less columns than a single Turbo code generator matrix, and accordingly requires Gauss elimination of 24 less columns, calculation complexity is reduced.

According to the method for decoding a Turbo code provided in this embodiment of the present invention, a combined generator matrix $G_{com}$ of a Turbo code generator matrix $G_{turbo}$ and a cyclic redundancy check CRC generator matrix $G_{crc}$ is acquired; a log likelihood ratio sequence outputted by a Turbo code decoder is acquired, CRC-assisted iterative ordered statistics decoding of the Turbo code is performed by using the combined generator matrix $G_{com}$ and the log likelihood ratio sequence, and a decoding processing result is obtained. Compared with the prior art, the method in this embodiment can improve the performance of Turbo code decoding and obtain a larger decoding gain.

On the basis of the embodiment shown in FIG. 1, in step S101, the acquiring a log likelihood ratio sequence outputted by a Turbo code decoder may specifically include the following two possible implementation manners:

One possible implementation manner is: acquiring a log likelihood ratio sequence outputted by a component decoder of the Turbo code decoder after iterative decoding for the number of first inner iterations.

A common Turbo code decoder includes two identical soft-input soft-output component decoders, an interleaver, and a corresponding deinterleaver. According to the embodiment of the present invention, a log likelihood ratio sequence of any component decoder of the Turbo code decoder may be acquired.

In a Turbo code decoding process, a maximum number of iterations is set. In this embodiment, the number of first iterations may be the maximum number of iterations; and after inner iterative decoding for the maximum number of iterations, a log likelihood ratio sequence of the last inner iteration by the component decoder is acquired.

After iterative decoding by a component decoder for the number of first inner iterations, reliability of a log likelihood ratio in the log likelihood ratio sequence outputted by the component decoder is improved and decoding accuracy is improved.

The other possible implementation manner is: after the component decoder performs iterative decoding for the number of second inner iterations, accumulating a log likelihood ratio output from each iteration, and acquiring an accumulated log likelihood ratio sequence.

After information received by a channel undergoes a period of iterative decoding, if the information can be successfully decoded, an outputted log likelihood ratio sequence becomes more accurate and reliable. However, as to a situation where the information cannot be successfully decoded by using an iterative Turbo decoding algorithm, a soft information symbol of each bit generally oscillates as the number of iterations increases. The oscillation of the soft information greatly affects accuracy of the reliability sequence. After iterative decoding for the fixed number of second iterations is performed, a soft value output from each iteration is accumulated. The fixed number of second iterations may be an integer greater than or equal to 1. An accumulated amplitude is more effective reliability measurement information and it may overcome an oscillation phenomenon and improve decoding accuracy.

Figure 3:
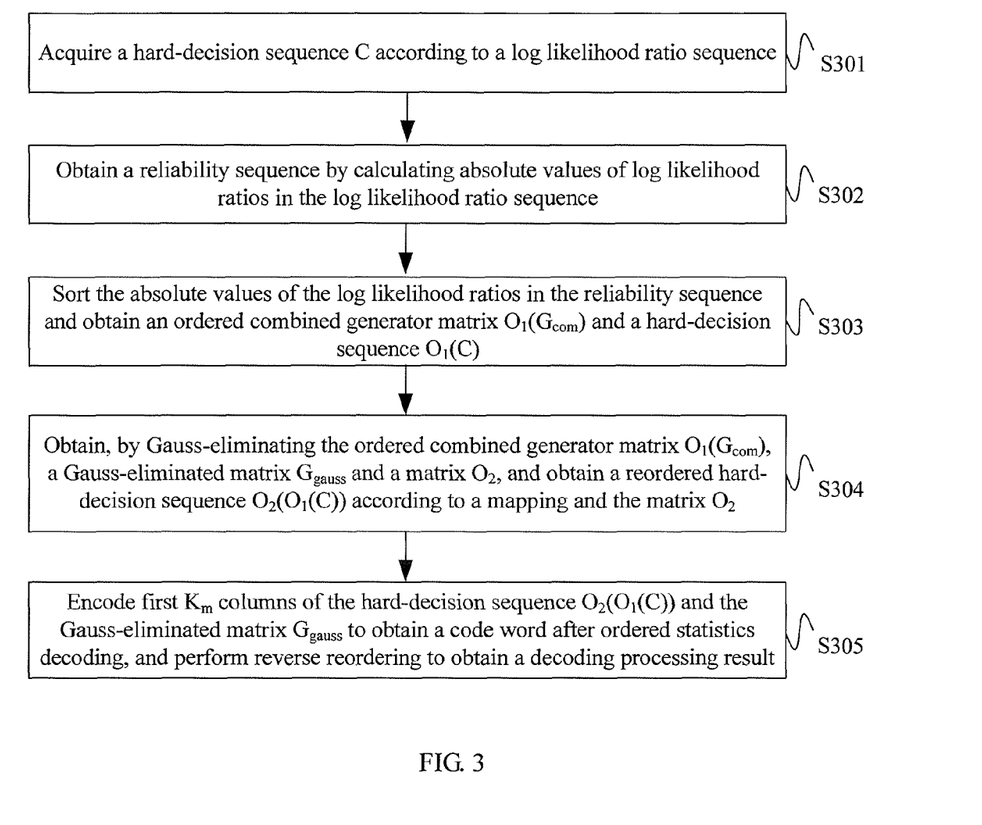
FIG. 3 is a schematic flowchart of a method for processing decoding according to Embodiment 2 of the present invention.

FIG. 3 is schematic flowchart of a method for processing decoding according to Embodiment 2 of the present invention. On the basis of an embodiment shown in FIG. 1, CRC-assisted iterative ordered statistics decoding of a Turbo code is performed by using a combined generator matrix $G_{com}$ and a log likelihood ratio sequence, and a decoding processing result is obtained. As shown in FIG. 3, the following steps are included:

S301: Acquire a hard-decision sequence C according to the log likelihood ratio sequence.

As can be seen from FIG. 2, a code word obtained after Turbo code encoding is 3K+12, where the first Kbits are an information sequence generated by an encoder, the other two K bits are check information generated by the encoder, and the last 12 bits are tail bits generated in the encoding process in order for a component encoder to return to zero. During the Turbo code decoding, the number of columns of the information sequence received by a component decoder of a Turbo code decoder is 3K+12; after inner iterative decoding by the component decoder, the number of columns of a log likelihood ratio sequence of output information bits is also 3K+12; the first 3K are selected for CRC-assisted iterative ordered statistics decoding of the Turbo code, and a log likelihood ratio sequence of the first 3K columns is $\{L_1 \ldots L_k, L_{k+1} \ldots L_{2k+1} \ldots L_{3k}\}$. As can further be seen from above, there is mapping between the log likelihood ratio sequence and columns of the Turbo code combined generator matrix $G_{com}$. In addition, because the combined generator matrix $G_{com}=G_{turbo} \cdot G_{crc}$, there is mapping between columns of the Turbo code generator matrix $G_{turbo}$ and the columns of the combined generator matrix $G_{com}$. That is, there is correspondence between the information sequence and the columns of the combined generator matrix $G_{com}$, there is also correspondence between the information sequence and the columns of the log likelihood ratio sequence, and consequently, there is correspondence between log likelihood ratios in the log likelihood ratio sequence and the columns of the Turbo code combined generator matrix $G_{com}$.

Because a log likelihood ratio sequence of soft outputs is not in binary after decision but is a likelihood value, a hard decision needs to be made for each log likelihood ratio in the log likelihood ratio sequence, so as to obtain a hard decision sequence. A specific process for the hard decision is as follows: if a log likelihood ratio is greater than or equal to 0, a value of an information bit in the corresponding hard-decision sequence C is 1; if the log likelihood ratio is smaller than 0, the value of the information bit in the corresponding hard-decision sequence C is 0.

As can further be seen, there is correspondence between log likelihood ratios in the log likelihood ratio sequence and values of information bits in the hard-decision sequence. In summary, there is correspondence between the log likelihood ratio sequence, the hard-decision sequence, and the columns of the combined generator matrix $G_{com}$.

S302: Obtain a reliability sequence by calculating absolute values of the log likelihood ratios in the log likelihood ratio sequence.

In ordered statistics decoding, reliability data mainly derives from amplitudes of log likelihood ratios. However, the log likelihood ratios may be either positive or negative. Therefore, the absolute values of the log likelihood ratios in the log likelihood ratio sequence are calculated, so as to obtain the reliability sequence.

S303: Sort the absolute values of the log likelihood ratios in the reliability sequence, and obtain an ordered combined generator matrix $O_1(G_{com})$ and a hard-decision sequence $O_1(C)$ according to the mapping.

A greater absolute value of a log likelihood ratio in the reliability sequence means that a symbol representing the bit information is more reliable. Therefore, to obtain relatively reliable bit information, the absolute values of the log likelihood ratios in the reliability sequence may be sorted in descending order, and a permutation pattern $O_1$ is obtained. At a same time, the combined generator matrix $G_{com}$ and the hard-decision sequence C are sorted according to mapping between the log likelihood ratio sequence, the hard-decision sequence, and the columns of the combined generator matrix $G_{com}$, so as to obtain an ordered combined generator matrix $O_1(G_{com})$ and a hard-decision sequence $O_1(C)$.

S304: Obtain a Gauss-eliminated matrix $G_{gauss}$ and a matrix $O_2$ by Gauss-eliminating the ordered combined generator matrix $O_1(G_{com})$, and obtain a reordered hard-decision sequence $O_2(O_1(C))$ according to the mapping and the matrix $O_2$.

In step S304, because the first $K_m$ columns are a length of an original information sequence, and a final decoding result requires a decoding result of the first $K_m$, Gauss elimination is performed on the ordered combined generator matrix $O_1(G_{com})$, where the first $K_m$ columns are eliminated to a unit matrix, so as to obtain a Gauss-eliminated matrix $G_{gauss}$. Because linear dependence may occur between the columns of the matrix in a Gauss elimination process, these linearly-dependent columns must be sorted again in descending order; a sorted permutation pattern is $O_2$; and a reordered hard-decision sequence $O_2(O_1(C))$ is obtained according to the mapping and the permutation pattern $O_2$.

The Gauss elimination includes two steps: first, the first $K_m$ columns of the combined generator matrix $O_1(G_{com})$ are eliminated to a unit matrix, so as to obtain the Gauss-eliminated matrix $G_{gauss}$; second, linearly-dependent columns of the combined generator matrix $O_1(G_{com})$ are sorted in descending order, so as to obtain the matrix $O_2$. The matrix $O_2$ may be presented in a form of a permutation pattern (Permutation pattern). For example, when column 1 and column 2 among the first $K_m$ columns are linearly dependent, column 2 is swapped with column $K_m+1$ of high reliability, sorting in descending order is performed, and the sorted permutation pattern $O_2$ may be a 1×3K matrix.

S305: Encode first $K_m$ columns of the hard-decision sequence $O_2(O_1(C))$ and the Gauss-eliminated matrix $G_{gauss}$ to obtain a code word $\tilde{C}$ after ordered statistics decoding, and perform reverse reordering to obtain a decoding processing result $C_1 = O_1^{-1}(O_2^{-1}(\tilde{C}))$.

First $K_m$ columns of the sorted hard-decision sequence $O_2(O_1(C))$ are selected to multiply with the Gauss-eliminated matrix $G_{gauss}$, and a code word $\tilde{C}$ after ordered statistics decoding is acquired.

Finally, the code word $\tilde{C}$ after ordered statistics decoding is reverse reordered twice, and the decoding processing result $C = O_1^{-1}(O_2^{-1}(\tilde{C}))$ is obtained.

According to the method for processing decoding provided in the embodiment of the present invention, in a situation where an appropriate output cannot be obtained through iterative Turbo decoding, CRC-assisted iterative ordered statistics decoding of a Turbo code is used. A correct decoding result may be obtained for lots of errors that cannot be corrected by an iteration, and a decoding gain is obvious.

Figure 4:
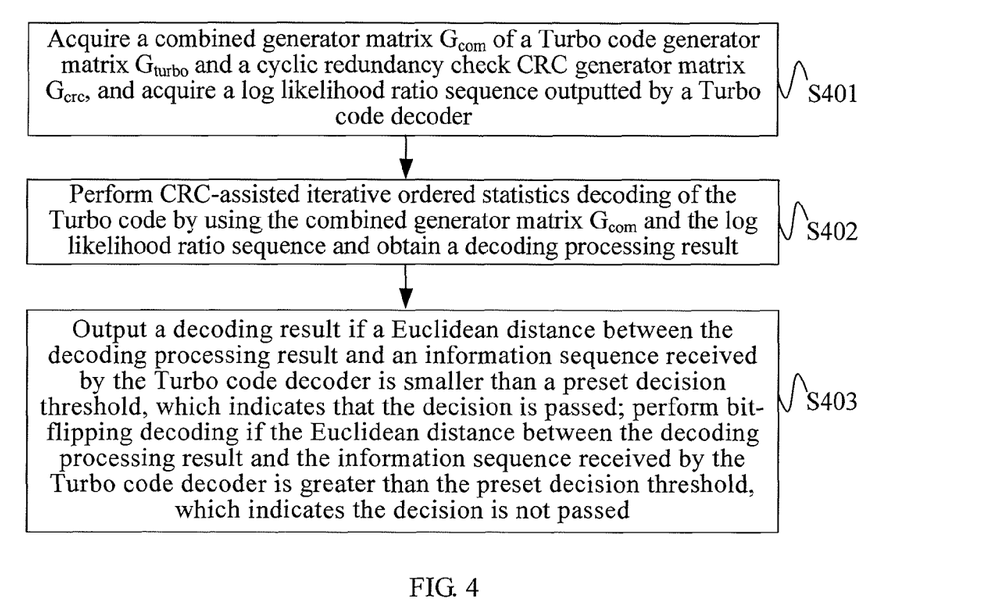
FIG. 4 is a schematic flowchart of a method for processing decoding according to Embodiment 3 of the present invention.

FIG. 4 is a schematic flowchart of a method for processing decoding according to Embodiment 3 of the present invention. As shown in FIG. 4, on the basis of an embodiment shown in FIG. 1 of the present invention, after a decoding processing result is obtained, step S403 is further included.

S401: Acquire a combined generator matrix $G_{com}$ of a Turbo code generator matrix $G_{turbo}$ and a cyclic redundancy check CRC generator matrix $G_{crc}$, and acquire a log likelihood ratio sequence outputted by a Turbo code decoder.

S402: Perform CRC-assisted iterative ordered statistics decoding of a Turbo code by using the combined generator matrix $G_{com}$ and the log likelihood ratio sequence, and obtain a decoding processing result.

S403: Output a decoding result if a Euclidean distance between the decoding processing result and an information sequence received by the Turbo code decoder is smaller than a preset decision threshold, which indicates that the decision is passed; perform bit-flipping decoding if the Euclidean distance between the decoding processing result and the information sequence received by the Turbo code decoder is greater than the preset decision threshold, which indicates that the decision is not passed.

In the foregoing method embodiments, after the decoding processing result is acquired, a decision needs to be made on a code word of the decoding processing result, and then the decoding result may be outputted. Step S401 and step S402 are the same as step S101 and step 102 in the embodiment shown in FIG. 1; a specific implementation process of step S402 is the same as an embodiment shown in FIG. 2; and no further details are provided in this embodiment.

In the foregoing decoding process, because CRC participates in the decoding, a code word in a decoding processing result must be compliant with CRC check, that is, in this decoding scheme, CRC can no longer serve as a criterion for determining whether the code word is correct. In an actual system, it cannot be determined whether a code block can be received.

Because it is relatively difficult to find a decision criterion so effective as CRC, in this embodiment of the present invention, when a decision is made on an output code word, a final output decoding result is selected according to a manner for deciding a false alarm and a missed detection in a binary detection event. A probability of a false alarm is: a probability that all correct frames outputted during CRC-assisted iterative ordered statistics decoding of a Turbo code are decided as incorrect under a condition that outputs from a Turbo iteration are incorrect. A probability of a missed detection is: a probability that all error frames outputted during CRC-assisted iterative ordered statistics decoding of a Turbo code is decided as correct under a condition that outputs from a Turbo iteration are incorrect. In a communications system, a missed detection is not permitted; only a false alarm of a low probability is permitted; therefore, a decision may be made on a code word in the decoding processing result according to a false alarm and a final decoding result is outputted.

Therefore, in the embodiment of the present invention, a decision method with a fixed threshold is used to make a decision on a code word outputted during CRC-assisted iterative statistics decoding of a Turbo code, so as to determine whether the code word needs to be retransmitted. The Euclidean distance between the code word in the decoding output result and the information sequence received by the Turbo code decoder is compared with the preset decision threshold. When the Euclidean distance between the code word in the decoding output result and the information sequence is smaller than the preset decision threshold, the decision is passed and the decoding result is outputted; and when the Euclidean distance between the code word in the decoding output result and the information sequence is greater than the preset decision threshold, the decision is not passed and bit flipping decoding is performed.

Selection of the preset decision threshold may be implemented according to a simulation statistics result. For example, during simulation, it is ensured that the number of error frames is at least 1000 and the total number of frames is at least 10000, so as to satisfy a statistics requirement. For a certain code length, with different signal-to-noise ratios and under a condition that iterative Turbo decoding is incorrect, a minimum value of the Euclidean distance between a code word in the decoding processing result of incorrectly decoded frames and the information sequence received by the Turbo code decoder is determined. On this basis, another selection manner is available for this method. For example, the Euclidean distance is divided by a minimum value among sums of absolute values in an input log likelihood ratio sequence, and any value smaller than the minimum value is determined as the preset decision threshold, thereby ensuring that in the communications system, no missed detection exists and only a false alarm of a small probability exists. The Euclidean distance is a real distance between two points in an m-dimensional space. One or more other selection manners derived from variation of the method are not enumerated in this embodiment of the present invention. Selection of a preset decision threshold may further be acquired in an empirical manner. This embodiment of the present invention does not set a specific limitation herein.

According to the method for processing decoding provided in the embodiment of the present invention, a decision is made on a code word in a decoding processing result, the code word in the decoding processing result can be effectively checked, and a correct code word is outputted.

Figure 5:
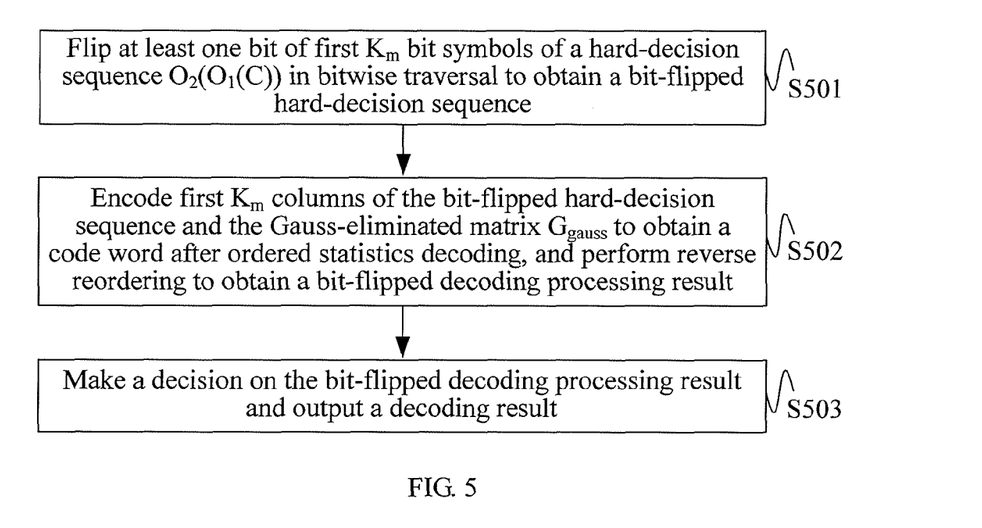
FIG. 5 is a schematic flowchart of a method for processing decoding according to Embodiment 4 of the present invention.

FIG. 5 is a schematic flowchart of a method for processing decoding according to Embodiment 4 of the present invention. As shown in FIG. 5, on the basis of an embodiment shown in FIG. 4, the embodiment of the present invention provides bit flipping decoding, including:

S501: Flipping at least one bit of first $K_m$ bit symbols of a hard-decision sequence $O_2(O_1(C))$ in bitwise traversal to obtain a bit-flipped hard-decision sequence.

In a specific implementation process, at least one bit of the first $K_m$ bit symbols of the descendingly sorted hard-decision sequence $O_2(O_1(C))$ may be flipped in bitwise traversal. Bit symbol flipping means that a bit is changed from 1 to 0, or from 0 to 1. In the embodiment, one bit may be flipped; that is, every bit symbol is flipped. Alternatively, two bits may be flipped, that is, every two bit symbols are flipped, and the bit-flipped hard-decision sequence is finally obtained.

In the case that at least one bit symbol is flipped in bitwise traversal, all the first $K_m$ bits that are reordered for encoding may undergo a 0-1 or 1-0 change. For each change, the code sequence needs to be multiplied by a Gauss-eliminated Turbo code generator matrix, where K×3K multiply-add operations are included. In a matrix multiplication operation, a change of the $i^{th}$ coded bit is only related to elements in the $i^{th}$ row of the generator matrix, and a code word outputted from encoding may be directly obtained through bit flipping: if the element at $i^{th}$ row $j^{th}$ column of the generator matrix is 0, the $j^{th}$ bit of the output code word is unchanged; otherwise, an XOR operation needs to be performed on the $j^{th}$ bit of the output code word and 1. Therefore, calculation of re-encoding requires a maximum of 3K XOR operations, and calculation complexity is reduced.

S502: Encode first $K_m$ columns of the bit-flipped hard-decision sequence and the Gauss-eliminated matrix $G_{gauss}$ to obtain a code word $\tilde{C}^k$ after ordered statistics decoding, and perform reverse reordering to obtain a bit-flipped decoding processing result $C_2 = O_1^{-1}(O_2^{-1}(\tilde{C}^k))$.

A difference between this step and step S305 in an embodiment shown in FIG. 3 is that the first $K_m$ columns of the bit-flipped hard-decision sequence and the Gauss-eliminated matrix $G_{gauss}$ are encoded to obtain a code word $\tilde{C}^k$ after at least order-1 ordered statistics encoding. Therefore, no further details about this step are provided in this embodiment of the present invention.

S503: Make a decision on the bit-flipped decoding processing result and output a decoding result.

If a Euclidean distance between a code word in the bit-flipped decoding processing result and an information sequence received by a Turbo decoder is smaller than a preset decision threshold, which indicates that the decision is passed, a decoding result is outputted; if the Euclidean distance between the code word in the bit-flipped decoding processing result and the information sequence received by the Turbo decoder is greater than the preset decision threshold, the code word in the bit-flipped decoding processing result is determined as an error code word, and retransmission of the information sequence is requested. Selection of the preset decision threshold is described in the foregoing method embodiment and no further details are provided herein.

In a specific operation process, the number of bit symbols to be flipped in bitwise traversal may be determined as required. Alternatively, one bit may be flipped in bit wise traversal; if a decision on a decoding processing result from 1-bit flipping in bit wise traversal is not passed, two bits may be flipped in bitwise traversal; if the decision is still not passed for this 2-bit flipping in bit wise traversal, the number of flipped bits may be extended to three or four or the like. A greater number of bits flipped in traversal means better decoding performance. However, the greater number of bits also means heavier calculation load. Therefore, a suitable number of bits to be flipped needs to be selected.

According to the method for processing decoding provided by the embodiment of the present invention, an error bit code that does not pass the decision can be corrected by bit-flipping a hard-decision sequence, thereby enhancing decoding accuracy and increasing a decoding gain.

The inventor performs system simulation by using the foregoing technical solutions. As can be seen from a simulation result, a gain of a Turbo code decoding method based on CRC-assisted iterative ordered statistics decoding of a Turbo code is large. Compared with an existing Max-Log-MAP iterative decoding scheme, about 2 dB more gain is provided.

Figure 6:
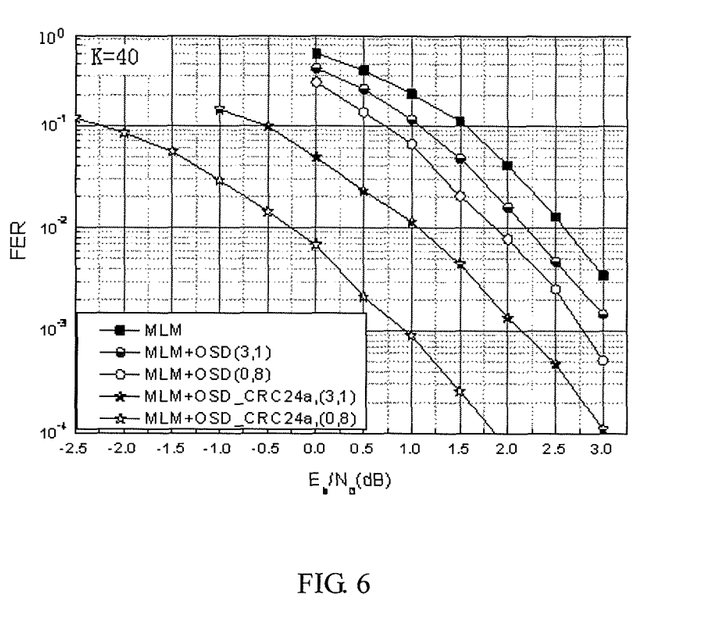
FIG. 6 is schematic diagram 1 showing a decoding performance curve of a method for processing decoding according to an embodiment of the present invention.

FIG. 6 is schematic diagram 1 showing a decoding performance curve of a method for processing decoding according to an embodiment of the present invention. In a communications system, generally, a relationship between $E_b/N_0$ and a frame error rate is a major performance index of the communications system. $E_b$ represents energy of a data signal per unit bit, and $N_0$ represents power of noise per unit bandwidth.

Simulation parameters are defined. A simulation parameter s means a likelihood ratio accumulation identifier, where s=0 means that likelihood ratio accumulation is not performed, and s=3 means that likelihood ratio accumulation is performed after a third Turbo iteration. A simulation parameter f means a frequency of calling ordered statistics decoding (Ordered Statistics Decoding, OSD for short), where f=1 means that OSD processing is performed only once after a last Turbo iteration, and f=8 means that OSD processing is performed after each Turbo iteration and for a total of 8 times. FIG. 6 shows an OSD-assisted Turbo iterative decoding manner in a form of OSD (s, f). In the simulation, a Max-Log-MAP (MLM) algorithm is used as a standard iterative decoding algorithm of a Turbo code.

In FIG. 6, a length K of an information sequence is 40. As can be seen from FIG. 6, for a relatively short code length, CRC-assisted iterative ordered statistics decoding of a Turbo code brings about a significant gain. Near a frame error rate (Frame Error Rate, FER for short) of 1e−1, a CRC-assisted and likelihood-ratios-accumulated scheme where an ordered statistics decoding is performed in a last iteration provides about 2 dB more gain compared with the conventional Max-Log-MAP iterative decoding scheme, and provides about 1.5 dB more encoding gain compared with non-CRC-assisted re-encoding with the iterative ordered statistics decoding scheme. Similarly, near a frame error rate of 1e−1, a scheme where ordered statistics decoding is performed after each iterative decoding provides about 3.75 dB more gain compared with the conventional Max-Log-MAP iterative decoding scheme, and provides about 2.95 dB more encoding gain compared with a non-CRC-assisted iterative ordered statistics decoding scheme. As can be seen, the CRC-assisted iterative ordered statistics decoding of a Turbo code has excellent decoding performance.

Figure 7:
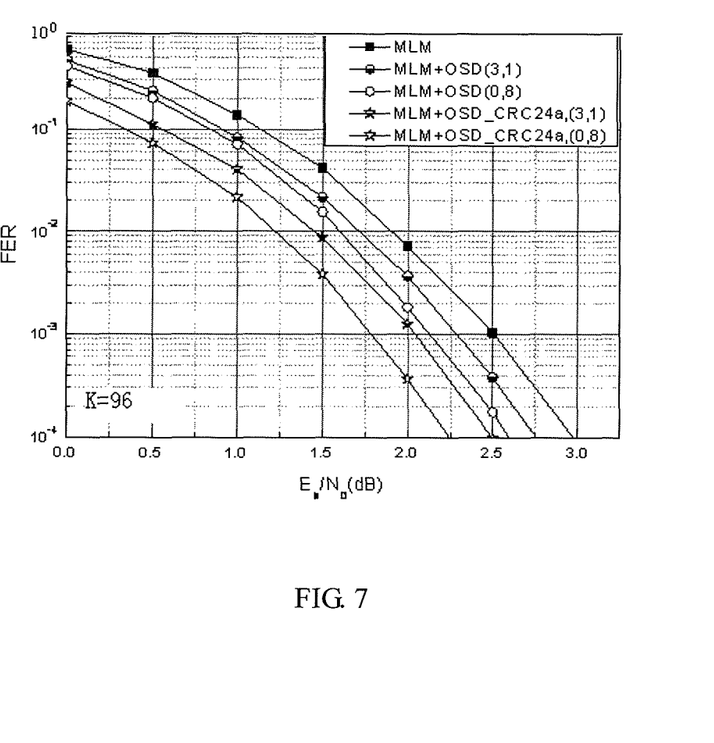
FIG. 7 is schematic diagram 2 showing a decoding performance curve of a method for processing decoding according to an embodiment of the present invention.
Figure 8:
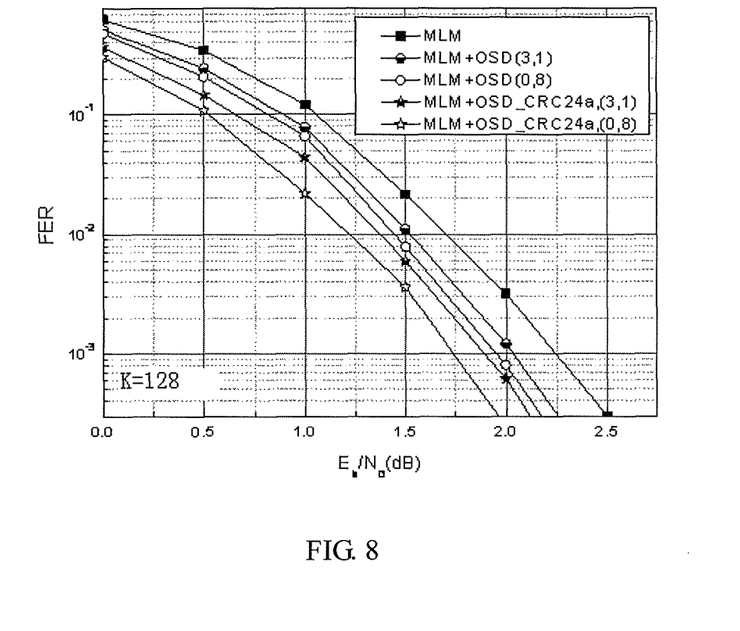
FIG. 8 is schematic diagram 3 showing a decoding performance curve of a method for processing decoding according to an embodiment of the present invention.
Figure 9:
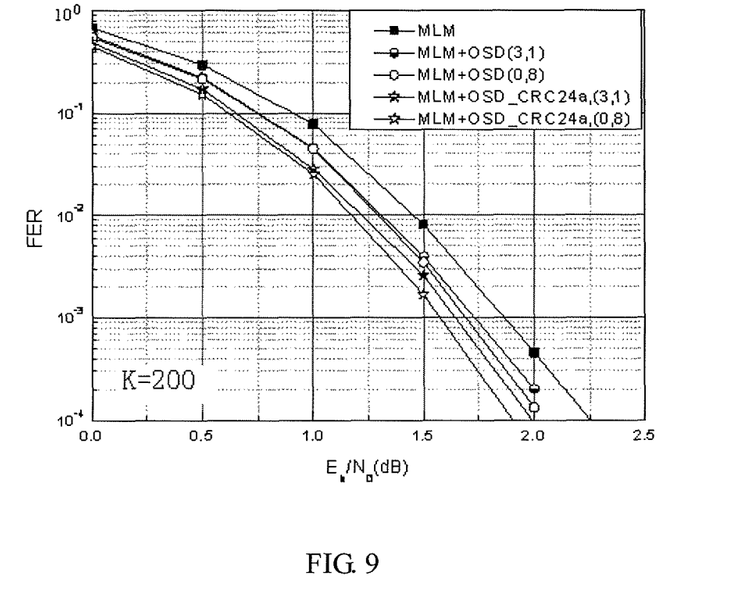
FIG. 9 is schematic diagram 4 showing a decoding performance curve of a method for processing decoding according to an embodiment of the present invention.
Figure 10:
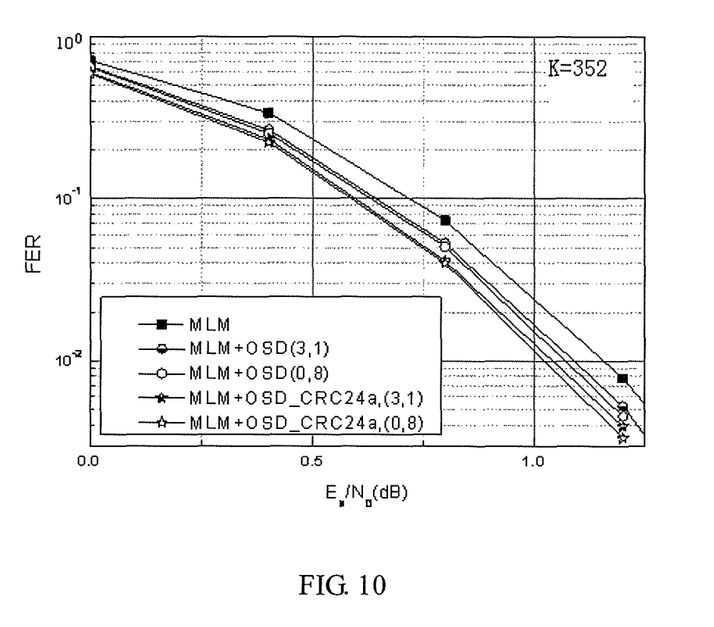
FIG. 10 is schematic diagram 5 showing a decoding performance curve of a method for processing decoding according to an embodiment of the present invention.

FIG. 7 is schematic diagram 2 showing a decoding performance curve of a method for processing decoding according to an embodiment of the present invention; FIG. 8 is schematic diagram 3 showing a decoding performance curve of a method for processing decoding according to an embodiment of the present invention; FIG. 9 is schematic diagram 4 showing a decoding performance curve of a method for processing decoding according to an embodiment of the present invention; and FIG. 10 is schematic diagram 5 showing a decoding performance curve of a method for processing decoding according to an embodiment of the present invention. FIG. 7 to FIG. 10 show CRC-assisted iterative ordered statistics decoding of a Turbo code applied to voice over Internet Protocol (Voice over Internet Protocol, VOIP for short) of an LTE system. A length K of an information sequence is 96, 128, 200, and 352, respectively. Simulation results are shown in FIG. 7 to FIG. 10 respectively. It can be seen from the simulation results that as a code length increases, a proportion of the 24-bit CRC decreases, and a decoding performance gain of CRC-assisted iterative ordered statistics decoding of a Turbo code also gradually decreases. Near a frame error rate of 1e−3, for a code length of 96, the CRC-assisted iterative ordered statistics decoding of a Turbo code achieves a maximum of about 0.7 dB gain compared with the conventional Max-Log-MAP iterative decoding; for a code length of 128, it can achieve about 0.5 dB gain; for a code length of 200, it can achieve about 0.3 dB encoding gain; and for a code length of 352, it can achieve about 0.13 dB encoding gain.

Figure 11:
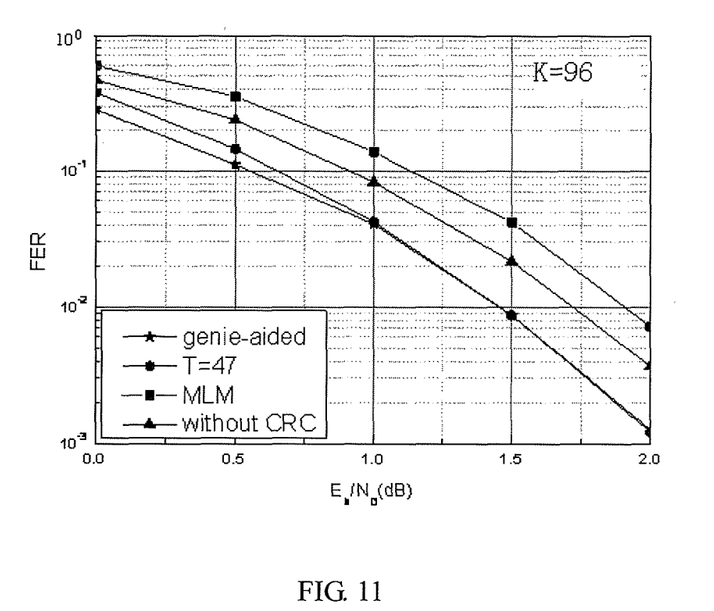
FIG. 11 is schematic diagram 6 showing a decoding performance curve of a method for processing decoding according to an embodiment of the present invention.

FIG. 11 is schematic diagram showing a decoding performance curve of a method for processing decoding according to an embodiment of the present invention, where FIG. 11 is a schematic diagram showing a decoding performance curve of the CRC-assisted iterative ordered statistics decoding of a Turbo code with a preset decision threshold of 47. "Genie-aided" is a decoding result of theoretical decoding obtained by comparing an original information sequence and the decoding result. As can be seen from FIG. 11, compared with theoretical decoding performance, performance of all actual decoding with the preset decision threshold has a little loss in a region of low signal-to-noise ratio, but still has a larger gain compared with non-CRC-assisted iterative ordered statistics decoding of the Turbo code.

Figure 12:
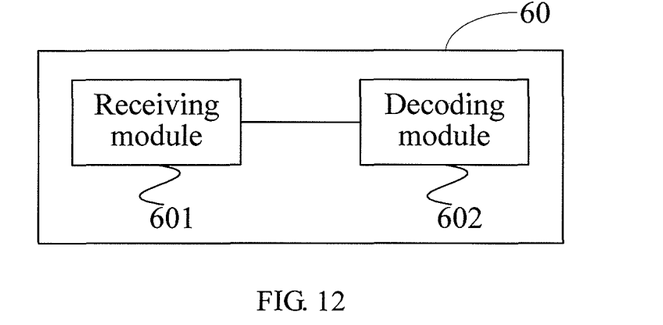
FIG. 12 is a schematic structural diagram of a decoder according to Embodiment 1.

FIG. 12 is a schematic structural diagram of a decoder according to Embodiment 1. As shown in FIG. 12, the decoder 60 provided by the embodiment of the present invention includes a receiving module 601 and a decoding module 602, where the receiving module 601 is configured to acquire a combined generator matrix $G_{com}$ of a Turbo code generator matrix $G_{turbo}$ and a cyclic redundancy check CRC generator matrix $G_{crc}$, and acquire a log likelihood ratio sequence outputted by the Turbo code decoder; and the decoding module 602 is configured to perform CRC-assisted iterative ordered statistics decoding of a Turbo code by using the combined generator matrix $G_{com}$ and the log likelihood ratio sequence, and obtain a decoding processing result.

The decoder provided in this embodiment may be configured to implement the technical solution in the method embodiment shown in FIG. 1; and its implementation principle and technical effect are similar to those in FIG. 1 and not detailed herein.

Alternatively, the receiving module 601 is specifically configured to acquire a log likelihood ratio sequence outputted by a component decoder of the Turbo code decoder after iterative decoding for the number of first inner iterations; or accumulate a log likelihood ratio outputted from each iteration after the component decoder performs iterative decoding for the number of second inner iterations, and acquire an accumulated log likelihood ratio sequence.

The decoder according to this embodiment may be configured to implement the technical solution in the method embodiment shown in FIG. 1; and its implementation principle and technical effect are similar and not detailed herein.

Alternatively, the decoding module 602 is specifically configured to:

acquire a hard-decision sequence C according to the log likelihood ratio sequence, where there is mapping between the log likelihood ratio sequence, the hard-decision sequence C, and the combined generator matrix $G_{com}$;

obtain a reliability sequence by calculating absolute values of log likelihood ratios in the log likelihood ratio sequence;

sort the absolute values of the log likelihood ratios in the reliability sequence and obtain an ordered combined generator matrix $O_1(G_{com})$ and a hard-decision sequence $O_1(C)$ according to the mapping;

obtain, by Gauss-eliminating the ordered combined generator matrix $O_1(G_{com})$, a Gauss-eliminated matrix $G_{gauss}$ and a matrix $O_2$, and obtain a reordered hard-decision sequence $O_2(O_1(C))$ according to the mapping and the matrix $O_2$; and encode first $K_m$ columns of the hard-decision sequence $O_2(O_1(C))$ and the Gauss-eliminated matrix $G_{gauss}$ to obtain a code word $\tilde{C}$ after ordered statistics decoding, and perform reverse reordering to obtain a decoding processing result $C_1=O_1^{-1}(O_2^{-1}(\tilde{C}))$, where $K_m$ is a length of an original information sequence.

The decoder according to this embodiment may be configured to implement the technical solution in the method embodiment shown in FIG. 3; and its implementation principle and technical effect are similar and not detailed herein.

Alternatively, the decoding module 602 is further specifically configured to:

output a decoding result if a Euclidean distance between the decoding processing result and the information sequence received by the Turbo code decoder is smaller than a preset decision threshold, which indicates that a decision is passed; and perform bit-flipping decoding if the Euclidean distance between the decoding processing result and the information sequence received by the Turbo code decoder is greater than the preset decision threshold, which indicates that the decision is not passed.

The decoder according to this embodiment may be configured to implement the technical solution in the method embodiment shown in FIG. 4; and its implementation principle and technical effect are similar and not detailed herein.

Alternatively, the decoding module 602 is specifically configured to:

flip at least one bit of first $K_m$ bit symbols of the hard-decision sequence $O_2(O_1(C))$ in bitwise traversal to obtain a bit-flipped hard-decision sequence; and encode the bit-flipped hard-decision sequence and the Gauss-eliminated matrix $G_{gauss}$ to obtain a code word $\tilde{C}^k$ after ordered statistics decoding, and perform reverse reordering to obtain a bit-flipped decoding processing result $C_2=O_1^{-1}(O_2^{-1}(\tilde{C}^k))$.

The decoder according to this embodiment may be configured to implement the technical solution in the method embodiment shown in FIG. 5; and its implementation principle and technical effect are similar and not detailed herein.

Alternatively, the decoding module 602 is further specifically configured to:

determine, under a condition that an iteration in the Turbo code decoding method is incorrect, a minimum value of the Euclidean distance between the decoding processing result of incorrectly decoded frames and the information sequence received by the Turbo code decoder; and determine any value smaller than the minimum value as the preset decision threshold.

The decoder according to this embodiment may be configured to implement a technical solution in the foregoing method embodiments; and its implementation principle and technical effect are similar and not detailed herein. The decoder may be used in a base station, a user equipment, or an entity that needs to execute a decoding action.

Figure 13:
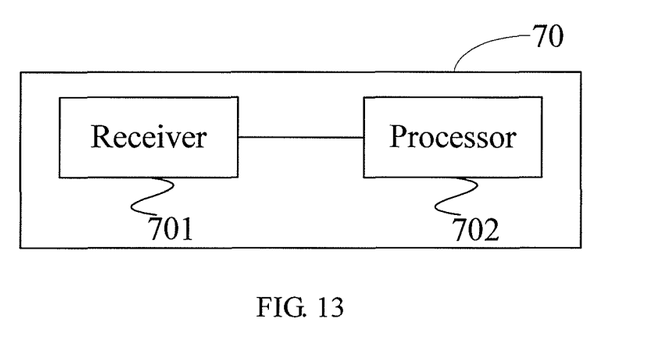
FIG. 13 is a schematic structural diagram of a decoder according to Embodiment 2.

FIG. 13 is a schematic structural diagram of a decoder according to Embodiment 2. As shown in FIG. 13, the decoder 70 provided by the embodiment of the present invention includes a receiver 701 and a processor 702, where the receiver 701 is configured to acquire a combined generator matrix $G_{com}$ of a Turbo code generator matrix $G_{turbo}$ and a cyclic redundancy check CRC generator matrix $G_{crc}$, and acquire a log likelihood ratio sequence outputted by the Turbo code decoder; the processor 702 is configured to perform CRC-assisted iterative ordered statistics decoding of a Turbo code by using the combined generator matrix $G_{com}$ and the log likelihood ratio sequence, and obtain a decoding processing result.

The decoder according to this embodiment may be configured to implement the technical solution in the method embodiment shown in FIG. 1; and its implementation principle and technical effect are similar and not detailed herein.

Alternatively, the receiver 701 is specifically configured to acquire a log likelihood ratio sequence outputted by a component decoder of the Turbo code decoder after iterative decoding for the number of first inner iterations; or accumulate a log likelihood ratio outputted from each iteration after the component decoder performs iterative decoding for the number of second inner iterations, and acquire an accumulated log likelihood ratio sequence.

The decoder according to this embodiment may be configured to implement a technical solution in the foregoing method embodiments; and its implementation principle and technical effect are similar and not detailed herein.

Alternatively, the processor 702 is specifically configured to:

acquire a hard-decision sequence C according to the log likelihood ratio sequence, where there is mapping between the log likelihood ratio sequence, the hard-decision sequence C, and the combined generator matrix $G_{com}$;

obtain a reliability sequence by calculating absolute values of log likelihood ratios in the log likelihood ratio sequence;

sort the absolute values of the log likelihood ratios in the reliability sequence and obtain an ordered combined generator matrix $O_1(G_{com})$ and a hard-decision sequence $O_1(C)$ according to the mapping;

obtain, by Gauss-eliminating the ordered combined generator matrix $O_1(G_{com})$, a Gauss-eliminated matrix $G_{gauss}$ and a matrix $O_2$, and obtain a reordered hard-decision sequence $O_2(O_1(C))$ according to the mapping and the matrix $O_2$; and encode first $K_m$ columns of the hard-decision sequence $O_2(O_1(C))$ and the Gauss-eliminated matrix $G_{gauss}$ to obtain a code word $\tilde{C}$ after ordered statistics decoding, and perform reverse reordering to obtain a decoding processing result $C_1=O_1^{-1}(O_2^{-1}(\tilde{C}))$ where $K_m$ is a length of an original information sequence.

The decoder according to this embodiment may be configured to implement the technical solution in the method embodiment shown in FIG. 3; and its implementation principle and technical effect are similar and not detailed herein.

Alternatively, the processor 702 is further specifically configured to:

output a decoding result if a Euclidean distance between the decoding processing result and the information sequence received by the Turbo code decoder is smaller than a preset decision threshold, which indicates that a decision is passed; and perform bit-flipping decoding if the Euclidean distance between the decoding processing result and the information sequence received by the Turbo code decoder is greater than the preset decision threshold, which indicates that the decision is not passed.

The decoder according to this embodiment may be configured to implement the technical solution in the method embodiment shown in FIG. 4; and its implementation principle and technical effect are similar and not detailed herein.

Alternatively, the processor 702 is specifically configured to:

flip at least one bit of first $K_m$ bit symbols of the hard-decision sequence $O_2(O_1(C))$ in bitwise traversal to obtain a bit-flipped hard-decision sequence; and encode the bit-flipped hard-decision sequence and the Gauss-eliminated matrix $G_{gauss}$ to obtain a code word $\check{C}^k$ after ordered statistics decoding, and perform reverse reordering to obtain a bit-flipped decoding processing result $C_2 = O_1^{-1}(O_2^{-1}(\check{C}^k))$.

The decoder according to this embodiment may be configured to implement the technical solution in the method embodiment shown in FIG. 5; and its implementation principle and technical effect are similar and not detailed herein.

Alternatively, the processor 702 is further specifically configured to:

determine, under a condition that an iteration in the Turbo code decoding method is incorrect, a minimum value of the Euclidean distance between the decoding processing result of incorrectly decoded frames and the information sequence received by the Turbo code decoder; and determine any value smaller than the minimum value as the preset decision threshold.

The decoder according to this embodiment may be configured to implement a technical solution in the foregoing method embodiments; and its implementation principle and technical effect are similar and not detailed herein. The decoder may be used in a base station, a user equipment, or an entity that needs to execute a decoding action.

The embodiment of the present invention further provides a processor; this processor is configured to acquire a combined generator matrix $G_{com}$ of a Turbo code generator matrix $G_{turbo}$ and a cyclic redundancy check CRC generator matrix $G_{crc}$, and acquire a log likelihood ratio sequence outputted by a Turbo code decoder, perform CRC-assisted iterative ordered statistics decoding of a Turbo code by using the combined generator matrix $G_{com}$ and the log likelihood ratio sequence, and obtain a decoding processing result. For an action executed by the processor, reference may be made to content in the methods for processing decoding provided by the embodiments and no further details are provided herein. The processor may exist in a decoder, a user equipment, a base station, or another entity that needs to execute a decoding action, and is configured to decode a Turbo code.

The processor in the embodiment of the present invention may be an integrated circuit chip and is capable of signal processing. In an implementation process, each step of the methods may be completed by an integrated logical circuit in the hardware of the processor, or by an instruction in a form of software. The processor may be a generic processor, a digital signal processor (DSP), an application-specific integrated circuit (ASIC), a field programmable gate array (FPGA), or another programmable logic device, an independent gate or a transistor logic device, or an independent hardware component, and may implement or execute various methods, steps, or logic block diagrams disclosed in embodiments of the present invention. The processor may be a microprocessor; or the processor may also be any conventional processor, decoder, or the like. Steps of the methods disclosed in embodiments of the present invention may be directly executed and completed by the hardware of the processor, or executed and completed by a combination of hardware and software modules in the processor. The software module can be placed in a storage medium that is mature in the technical field, such as a random access memory, a flash memory, a read-only memory, a programmable read-only memory, an electrically erasable programmable memory, or a register. The storage medium is placed in a storage device; the processor reads information from the storage device and works with the hardware to complete steps of the foregoing methods.

The embodiment of the present invention further provides a chip; this chip is configured for decoding processing and this chip may include the processor.

A person of ordinary skill in the art may understand that, all or a part of the steps of the foregoing method embodiments may be implemented by a program instructing relevant hardware. The foregoing program may be stored in a computer readable storage medium. When the program runs, the steps of the foregoing method embodiments are performed. The foregoing storage medium includes: any mediums that can store program code, such as a USB flash drive, a removable hard disk, a read-only memory (Read-Only Memory, ROM), a random access memory (Random Access Memory, RAM), a magnetic disk, or an optical disc.

In the several embodiments provided in the present application, it should be understood that the disclosed system, apparatus, and method may be implemented in other manners. For example, the described apparatus embodiments are merely exemplary. For example, the unit division is merely logical function division and may be other division in actual implementation. For example, multiple units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical, or other forms.

The units described as separate parts may or may not be physically separate, and the parts displayed as units may or may not be physical units, may be located in one position, or may be distributed on multiple network units. Apart of or all of the units may be selected according to actual needs to achieve the objectives of the solutions of the embodiments.

Finally, it should be noted that the foregoing embodiments are merely intended for describing the technical solutions of the present invention other than limiting the present invention. Although the present invention is described in detail with reference to the foregoing embodiments, a person of ordinary skill in the art should understand that he may still make modifications to the technical solutions described in the foregoing embodiments or make equivalent replacements to some or all the technical features thereof, without departing from the spirit and scope of the technical solutions of the embodiments of the present invention.

What is claimed is:

1. A method for processing decoding, the method comprising:

acquiring a combined generator matrix $G_{com}$ of a Turbo code generator matrix $G_{turbo}$ and a cyclic redundancy check (CRC), generator matrix $G_{crc}$;

acquiring a log likelihood ratio sequence output by a Turbo code decoder; and performing ordered statistics decoding (OSD) by using the combined generator matrix $G_{com}$ and the log likelihood ratio sequence based on CRC-assisted iteration of a Turbo code, and obtaining a decoding processing result.

2. The method according to claim 1, wherein acquiring a log likelihood ratio sequence output by a Turbo code decoder comprises:

acquiring a log likelihood ratio sequence output by a component decoder of the Turbo code decoder after iterative decoding for the number of first inner iterations; or accumulating a log likelihood ratio output from each iteration after the component decoder performs iterative decoding for the number of second inner iterations, and acquiring an accumulated log likelihood ratio sequence.

3. The method according to claim 1, wherein performing ordered statistics decoding (OSD) by using the combined generator matrix $G_{com}$ and the log likelihood ratio sequence based on CRC-assisted iteration of a Turbo code, and obtaining a decoding processing result comprises:

acquiring a hard-decision sequence C according to the log likelihood ratio sequence, wherein there is mapping between the log likelihood ratio sequence, the hard-decision sequence C, and the combined generator matrix $G_{com}$;

obtaining a reliability sequence by calculating absolute values of log likelihood ratios in the log likelihood ratio sequence;

sorting the absolute values of the log likelihood ratios in the reliability sequence, and obtaining an ordered combined generator matrix $O_1(G_{com})$ and a hard-decision sequence $O_1(C)$ according to the mapping;

obtaining, by Gauss-eliminating the ordered combined generator matrix $O_1(G_{com})$, a Gauss-eliminated matrix $G_{gauss}$ and a matrix $O_2$, and obtaining a reordered hard-decision sequence $O_2(O_1(C))$ according to the mapping and the matrix $O_2$; and encoding first $K_m$ columns of the hard-decision sequence $O_2(O_1(C))$ and the Gauss-eliminated matrix $G_{gauss}$ to obtain a code word $\tilde{C}$ after ordered statistics decoding, and performing reverse reordering to obtain a decoding processing result $C_1 = O_1^{-1}(O_2^{-1}(\tilde{C}))$, wherein $K_m$ is a length of an original information sequence.

4. The method according to claim 3, after obtaining a decoding processing result, the method further comprises:

outputting a decoding result if a Euclidean distance between the decoding processing result and the information sequence received by the Turbo code decoder is smaller than a preset decision threshold, which indicates that a decision is passed; and performing bit-flipping decoding if the Euclidean distance between the decoding processing result and the information sequence received by the Turbo code decoder is greater than the preset decision threshold, which indicates that the decision is not passed.

5. The method according to claim 4, wherein performing bit-flipping decoding comprises:

flipping at least one bit of first $K_m$ bit symbols of the hard-decision sequence $O_2(O_1(C))$ in bitwise traversal to obtain a bit-flipped hard-decision sequence; and encoding the bit-flipped hard-decision sequence and the Gauss-eliminated matrix $G_{gauss}$ to obtain a code word $\tilde{C}^k$ after ordered statistics decoding, and performing reverse reordering to obtain a bit-flipped decoding processing result $C_2 = O_1^{-1}(O_2^{-1}(\tilde{C}^k))$.

6. The method according to claim 4, wherein the preset decision threshold is determined in a manner comprising:

determining, under a condition that an iteration in the Turbo code decoding method is incorrect, a minimum value of the Euclidean distance between the decoding processing result of incorrectly decoded frames and the information sequence received by the Turbo code decoder; and determining any value smaller than the minimum value as the preset decision threshold.

7. A decoder, comprising:
a receiver, configured to:
acquire a combined generator matrix $G_{com}$ of a Turbo code generator matrix $G_{turbo}$ and a cyclic redundancy check (CRC) generator matrix $G_{crc}$; and
acquire a log likelihood ratio sequence outputted by a Turbo code decoder; and a processor, configured to perform ordered statistics decoding (OSD) by using the combined generator matrix $G_{com}$ and the log likelihood ratio sequence based on CRC-assisted iteration of a Turbo code, and obtain a decoding processing result.

8. The decoder according to claim 7, wherein the receiver is configured to:

acquire the log likelihood ratio sequence that is outputted by a component decoder of the Turbo code decoder after iterative decoding for the number of first inner iterations; or accumulate a log likelihood ratio outputted from each iteration after the component decoder performs iterative decoding for the number of second inner iterations, and acquire an accumulated log likelihood ratio sequence.

9. The decoder according to claim 7, wherein the processor is configured to:

acquire a hard-decision sequence C according to the log likelihood ratio sequence, wherein there is mapping between the log likelihood ratio sequence, the hard-decision sequence C, and the combined generator matrix $G_{com}$;

obtain a reliability sequence by calculating absolute values of log likelihood ratios in the log likelihood ratio sequence;

sort the absolute values of the log likelihood ratios in the reliability sequence and obtain an ordered combined generator matrix $O_1(G_{com})$ and a hard-decision sequence $O_1(C)$ according to the mapping;

obtain, by Gauss-eliminating the ordered combined generator matrix $O_1(G_{com})$, a Gauss-eliminated matrix $G_{gauss}$ and a matrix $O_2$, and obtain a reordered hard-decision sequence $O_2(O_1(C))$ according to the mapping and the matrix $O_2$; and encode first $K_m$ columns of the hard-decision sequence $O_2(O_1(C))$ and the Gauss-eliminated matrix $G_{gauss}$ to obtain a code word $\tilde{C}$ after ordered statistics decoding, and perform reverse reordering to obtain a decoding processing result $C_1 = O_1^{-1}(O_2^{-1}(\tilde{C}^k))$, wherein $K_m$ is a length of an original information sequence.

10. The decoder according to claim 9, wherein the processor is further configured to:

output a decoding result if a Euclidean distance between the decoding processing result and the information sequence received by the Turbo code decoder is smaller than a preset decision threshold, which indicates that a decision is passed; and perform bit-flipping decoding if the Euclidean distance between the decoding processing result and the information sequence received by the Turbo code decoder is greater than the preset decision threshold, which indicates that the decision is not passed.

11. The decoder according to claim 10, wherein when performing bit-flipping decoding, the processor is configured to:

flip at least one bit of first $K_m$ bit symbols of the hard-decision sequence $O_2(O_1(C))$ in bitwise traversal to obtain a bit-flipped hard-decision sequence; and encode the bit-flipped hard-decision sequence and the Gauss-eliminated matrix $G_{gauss}$ to obtain a code word $\tilde{C}^k$ after ordered statistics decoding, and perform reverse reordering to obtain a bit-flipped decoding processing result $C_2=O_1^{-1}(O_2^{-1}(\tilde{C}^k))$.

12. The decoder according to claim 10, wherein the processor is further configured to:

determine, under a condition that an iteration in the Turbo code decoding method is incorrect, a minimum value of the Euclidean distance between the decoding processing result of incorrectly decoded frames and the information sequence received by the Turbo code decoder; and determine any value smaller than the minimum value as the preset decision threshold.

\* \* \* \* \*